United States Patent
Kyoda et al.

(10) Patent No.: US 6,437,234 B1
(45) Date of Patent: Aug. 20, 2002

(54) PHOTOELECTRIC CONVERSION DEVICE AND MANUFACTURING METHOD THEREOF

(75) Inventors: Takeshi Kyoda; Shin Sugawara; Hisao Arimune, all of Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/917,140

(22) Filed: Jul. 26, 2001

(30) Foreign Application Priority Data

Jul. 27, 2000 (JP) ........................................ 2000-227639
Aug. 28, 2000 (JP) ........................................ 2000-258026
Dec. 27, 2000 (JP) ........................................ 2000-396716

(51) Int. Cl.$^7$ ...................... H01L 31/0352; H01L 31/18
(52) U.S. Cl. .................... 136/250; 257/431; 257/464; 438/63
(58) Field of Search ................. 136/250; 257/431, 257/464; 438/63

(56) References Cited

U.S. PATENT DOCUMENTS

| | | | | |
|---|---|---|---|---|
| 4,806,495 A | * | 2/1989 | Levine et al. ................. | 438/63 |
| 4,872,607 A | * | 10/1989 | Jensen et al. ............... | 136/250 |
| 5,415,700 A | * | 5/1995 | Arthur et al. ............... | 136/250 |
| 5,674,325 A | * | 10/1997 | Albright et al. ............ | 136/250 |

FOREIGN PATENT DOCUMENTS

| | | | |
|---|---|---|---|
| DE | 2326156 | * | 12/1974 |
| JP | 55-158678 A | * | 12/1980 |
| JP | 61-124179 | | 6/1986 |
| JP | 3-228379 A | * | 10/1991 |
| JP | 8-34177 | | 3/1996 |
| JP | 2641800 | | 5/1997 |

* cited by examiner

*Primary Examiner*—Alan Diamond
(74) *Attorney, Agent, or Firm*—Hogan & Hartson, L.L.P.

(57) ABSTRACT

A method of manufacturing a photoelectric conversion device according to the present invention comprises the steps of: applying numerous glass particles having a particle size before baking being 5 to 25% of that of crystalline semiconductor particles to a substrate having an electrode of one side; depositing the crystalline semiconductor particles on the layer of the glass particles; pressing the crystalline semiconductor particles against the substrate; and subjecting them to baking, whereby manufacturing a photoelectric conversion device in which the crystalline semiconductor particles and the substrate have been joined together as well as an insulator has been interposed among the crystalline semiconductor particles. Accordingly, the photoelectric conversion device has good conversion efficiency and is manufactured at a low cost.

15 Claims, 4 Drawing Sheets

FIG. 4A
FIG. 4B
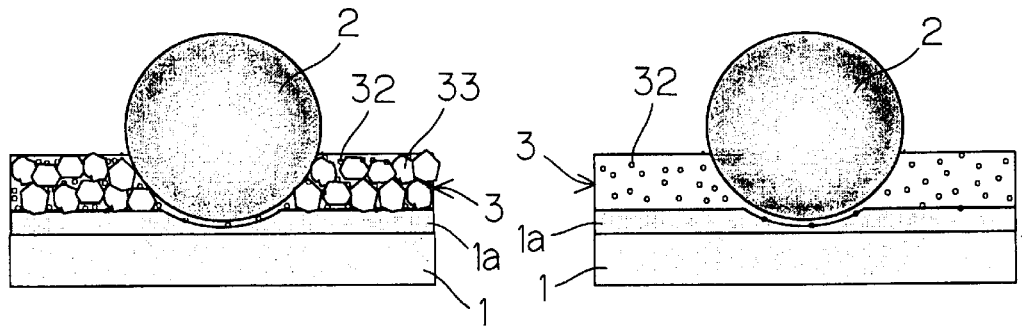
FIG. 5A
FIG. 5B
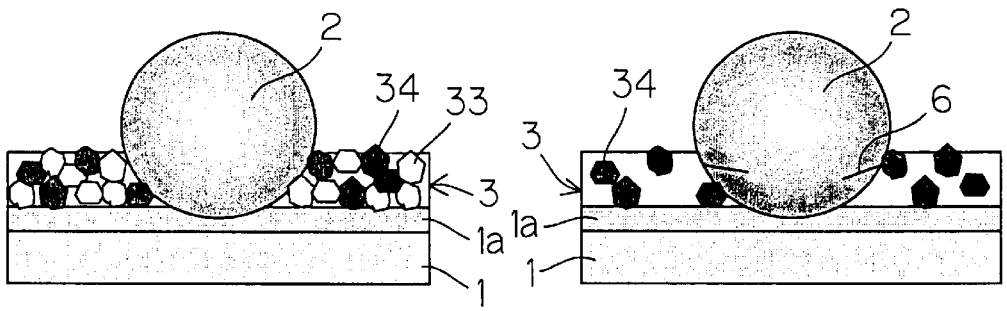
FIG. 6
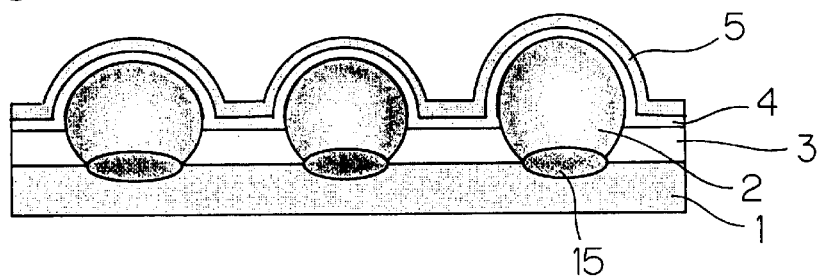
FIG. 7
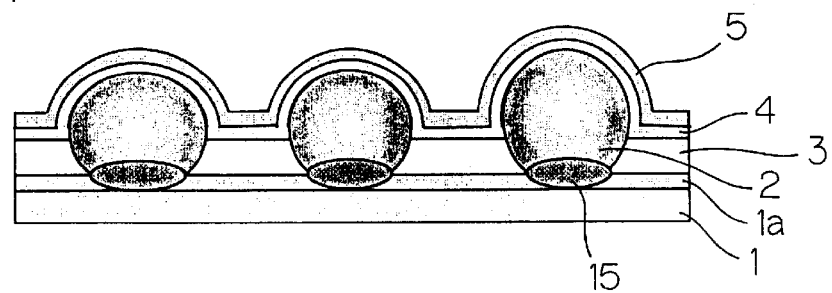

PHOTOELECTRIC CONVERSION DEVICE AND MANUFACTURING METHOD THEREOF

This application is based on applications Nos. 2000-227639, 2000-258026 and 2000-396716 filed in Japan, the contents of which are incorporated hereinto by reference.

BACKGROUND OF THE INVENTION

1. Field of the Invention

The present invention relates to a photoelectric conversion device using numerous crystalline semiconductor particles, and to a manufacturing method thereof. The photoelectric conversion device according to this invention is utilized suitably in solar cells.

2. Description of the Related Art

Advent of a next-generation, low-cost solar cell that allows the quantity of silicon material to be small has been eagerly awaited.

Conventional photoelectric devices using crystalline semiconductor particles are shown in FIGS. 9–11.

FIG. 9 shows a structure disclosed in Japanese Patent Laid-Open Publication No. S61-124179. In this photoelectric conversion device, a first aluminum foil 10 is provided with openings 10a into which silicon balls 2 having n-type surface portions 9 on the surfaces of p-type balls are inserted. The n-type surface portions 9 of the silicone balls 2 projecting from the rear surface of the first aluminum foil 10 are then removed. An oxide layer 3 is formed on the rear surface side of the first aluminum foil 10, and then a second aluminum foil 8 is formed such that it eliminates the oxide layer 3 at parts covering the silicon particles so as to be joined to the silicon particles 2.

FIG. 10 shows a structure disclosed in Japanese Patent No. 2641800. In this photoelectric conversion device, a low-melting-point metal layer 11 such as a tin layer is formed on a substrate 1. First conductivity-type crystalline semiconductor particles 2 are deposited on the low-melting-point metal layer 11, on which a second conductivity-type amorphous semiconductor layer 7 is formed with an insulating layer 3 interposed between it and the low-melting-point metal layer 11.

FIG. 11 shows a structure in Japanese Patent Publication No. H8-34177 disclosing a method in which a high-melting-point metal layer 12, a low-melting-point metal layer 11, and semiconductor microcrystalline particles 13 are deposited on a substrate 1, and the semiconductor microcrystalline particles 13 are fused, saturated and gradually cooled so that the semiconductor is grown by liquid phase epitaxial growth, thereby transforming the semiconductor microcrystalline particles 13 into a polycrystalline thin film. In FIG. 11, the numeral 14 denotes the opposite conductivity-type polycrystalline or amorphous semiconductor layer, and the numeral 6 denotes a transparent conductive layer.

However, according to the photoelectric conversion device shown in FIG. 9, the first aluminum foil 10 needs to be formed with openings into which the silicon balls 2 are pressed so as to join the n-layer 9 of the silicon balls 2 to the aluminum foil 10. Therefore, evenness is required for the particle sizes of the silicon balls 2, which causes high manufacturing costs.

In addition, in the photoelectric conversion device shown in FIG. 10, since the insulator 3 is formed after securing the crystalline semiconductor particles 2 on the low-melting-point metal layer 11, the insulator 3 is formed not only on the low-melting-point metal layer 11 but also on the crystalline semiconductor particles 2. Accordingly, it is necessary to remove the insulator 3 on the crystalline semiconductor particles 2 before forming the amorphous semiconductor layer 7. The number of processes therefore increases necessitating stricter management of the cleaning process and the manufacturing environment, which leads to a high-cost production.

Also, the photoelectric conversion device shown in FIG. 11 has problems that the low melting-point metal 11 mixes into the first conductivity-type liquid phase epitaxial polycrystalline layer 13, thereby deteriorating the performance, and that the absence of insulator causes leakage to occur between the layer and the lower electrode 12.

BRIEF SUMMARY OF THE INVENTION

A primary object of the present invention is to provide a photoelectric conversion device having good conversion efficiency that can be manufactured at a low cost, and a manufacturing method thereof.

A method of manufacturing a photoelectric conversion device according to the present invention comprises the steps of: applying numerous glass particles having a particle size before baking being 5 to 25% of that of crystalline semiconductor particles to a substrate having an electrode of one side; depositing the crystalline semiconductor particles on the layer of the glass particles; pressing the crystalline semiconductor particles against the substrate; and subjecting them to baking, whereby manufacturing a photoelectric conversion device in which the crystalline semiconductor particles and the substrate are in contact together as well as an insulator has been interposed among the crystalline semiconductor particles (claim 1).

According to this method of manufacturing a photoelectric conversion device, since the glass particles are in the above-mentioned range in particle size, it is possible to apply the insulator to the substrate in a relatively uniform manner. In addition, when the crystalline semiconductor particles are pressed against the substrate, the glass particles are ejected from between the substrate and the semiconductor particles such that the glass particles slide into beside the semiconductor particles, so that an ohmic contact can be formed between the substrate and the semiconductor particles.

A photoelectric conversion device according to the present invention comprises: a substrate having an electrode of one side; numerous crystalline semiconductor particles deposited on the substrate; and an insulator interposed among the crystalline semiconductor particles, wherein the insulator is formed by baking a layer of glass particles that has been applied to the substrate, the insulator comprising a filler having a particle size being 5 to 25% of that of the crystalline semiconductor particles (claim 4).

According to this photoelectric conversion device, even when the glass particles are small in particle size, as long as the filler is in the above-mentioned range in particle size, the glass particles are ejected along with the filler from between the substrate and the silicon particles to be located beside the silicon particles when the silicon particles are pressed against the substrate.

Another method of manufacturing a photoelectric conversion device according to the present invention comprises the steps of: applying numerous glass particles including a filler dispersed therein to a substrate having an electrode of one side; depositing crystalline semiconductor particles on the layer of the glass particles; pressing the crystalline semiconductor particles against the substrate; and subjecting them to baking, whereby manufacturing a photoelectric conversion device in which the crystalline semiconductor particles and the substrate are in contact together as well as an insulator has been interposed among the crystalline semiconductor particles (claim 7).

According to this method of manufacturing a photoelectric conversion device, the filler particles that have been dispersed within the glass particles are dispersed homogeneously within the insulator layer by the melting of the glass particles at the baking temperature. Accordingly, unevenness in thermal expansion coefficient in the insulator layer is lessened and generation of cracks caused by stress is prevented from occurring in the semiconductor particles.

In addition, another photoelectric conversion device according to the present invention comprises: a substrate having an electrode of one side; numerous crystalline semiconductor particles deposited on the substrate; and an insulator interposed among the crystalline semiconductor particles, wherein the glass insulator comprises plural materials, and has a thermal expansion coefficient in the range of $30 \times 10^{-7}/°C$. to $60 \times 10^{-7}/°C$., and a softening point of 500° C. or below (claim 14).

According to this photoelectric conversion device, numerous crystalline semiconductor particles are deposited on a substrate and heated so that both of them are joined together by alloy portions where both of them are fused, and an insulator is interposed among the numerous crystalline semiconductor particles. The structure being as above, this invention allows for formation of a good insulator in which generation of defects such as cracks and voids is prevented, thereby providing a photoelectric conversion device with high reliability.

As has been discussed so far, by the method of manufacturing a photoelectric conversion device according to the present invention or by the photoelectric conversion device according to the present invention, it is possible to form a good insulator while contacting a substrate and semiconductor particles together. That is, it is not necessary to bore holes in the electrodes, and single conductivity-type semiconductor particles with low particle size accuracy can be used, as well as light incident on areas where the semiconductor particles are not present can be utilized. Furthermore, the insulator above can prevent current leaks from occurring between the semiconductor layer and the electrode of the substrate.

Accordingly, it is possible to achieve high conversion efficiency at a lower cost.

Furthermore, owing to the flexibility in shape, a photoelectric conversion device having little dependence on the light incidence angle can be provided by this invention.

Structural details of the present invention are hereinafter described referring to the accompanying drawings.

BRIEF DESCRIPTION OF THE DRAWINGS

FIG. 4A is a schematic sectional view showing partially a photoelectric conversion device according to a comparative example when a semiconductor particle is pressed against a substrate before an insulator layer is baked.

FIG. 4B is a schematic sectional view showing partially the photoelectric conversion device according to the comparative example after the insulator layer has been baked.

FIG. 5A is a schematic sectional view showing partially a photoelectric conversion device according to another comparative example when a semiconductor particle is pressed against a substrate before an insulator layer is baked.

FIG. 5B is a schematic sectional view showing partially the photoelectric conversion device according to the comparative example after the insulator layer has been baked.

FIG. 6 is a schematic sectional view showing a photoelectric conversion device according to a third embodiment of the present invention.

FIG. 7 is a schematic sectional view showing another photoelectric conversion device according to the third embodiment of the present invention.

DETAILED DESCRIPTION OF THE INVENTION

1. First Embodiment

Figure 1:
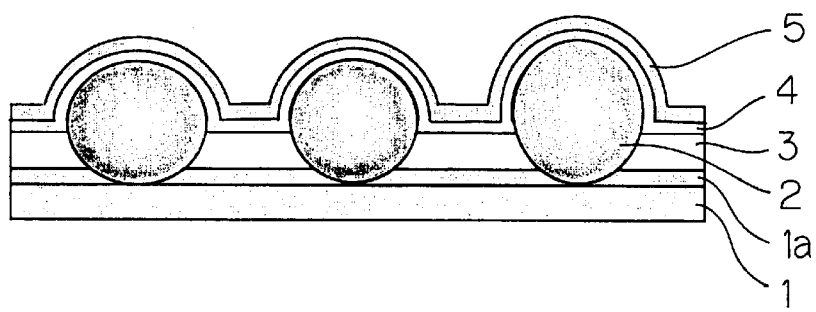
FIG. 1 is a schematic sectional view of a photoelectric conversion device according to a first or a second embodiment of the present invention.
Figure 2:
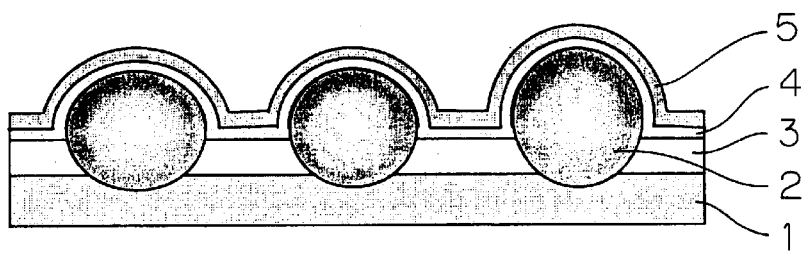
FIG. 2 is a schematic sectional view showing another photoelectric conversion device according to the first or the second embodiment of the present invention.

FIGS. 1 and 2 illustrate an embodiment of the photoelectric conversion device according to the present invention, wherein the numerals denote parts as follows: 1: substrate, 1a: conductive layer, 2: first conductivity-type semiconductor particles, 3: insulator, 4: conductive layer, 5: protective layer The substrate 1 comprises metal, ceramics, or resin. When the substrate 1 comprises an insulator such as ceramics or resin, a conductive layer 1a needs to be formed on the substrate 1 as shown in FIG. 1. When metal is used for the substrate 1, the substrate 1 is formed as a single metal layer or a combined layer comprising different kinds of metal layers.

The first conductivity-type semiconductor particles 2 comprise Si, Ge, and a small amount of a p-type impurity such as B, Al, and Ga or a n-type impurity such as P, As and the like added thereto.

The shapes of the semiconductor particles 2 may comprise polygons, curved surfaces or the like. Preferably, they should comprise curved surfaces, especially spherical shapes so that the semiconductor particles 2 efficiently push the insulator layer 3 aside when they are pressed from above the insulator layer 3 until they come into contact with the substrate 1 as mentioned later. Also, by having such convex surfaces, dependence on the light incidence angle can be small.

The particle sizes may be even or uneven. However, uneven particle sizes will be advantageous to make the device less expensive, because an additional process is necessary in order to uniformize the particle sizes. Incidentally, the semiconductor particles 2 will be brought into sufficient contact with the substrate 1 even when the particle sizes are uneven by using a pressing jig made of a flexible material for pressing the semiconductor particles 2 from above the insulator layer 3.

In addition, the semiconductor particle 2 are not limited to the single conductivity-type semiconductor particles mentioned above, but may be p-type semiconductor particles having surface layers including a n-type impurity such as P and As, or n-type semiconductor particles having surface layers comprising Si, Ge, and a p-type impurity such as B, AL, and Ga.

The insulator 3 is formed for separating the positive electrode from the negative electrode. The main material for the insulator may be, for example, $SiO_2$, $B_2O_3$, $Al_2O_3$, CaO, MgO, $P_2O_5$, $Li_2O$, SnO, PbO, ZnO, BaO and the like. A paste of glass particles composed mainly of one or a plurality of the materials above is used. The insulator 3 needs to have some degree of hardness or viscosity when placed on the substrate 1 so as to temporarily hold the semiconductor particles 2 pressed thereinto.

The "main material" here refers to a material that fuses at the heat treatment temperature losing its initial shape, and hardens by cooling so as to form a glass structure of the insulating layer 3. On the other hand, the "filler", which will be explained later, refers to a material or particles that do not fuse at the heat treatment temperature almost holding the initial shape, and remain within the glass structure of the insulating layer being mixed therein.

The insulator 3 forms the insulator layer 3 as well as partly covers the semiconductor particles 2 by melting when baked at a temperature applied thereto for creating an ohmic junction between the substrate 1 and the semiconductor particles 2 as mentioned later.

What is important here is that the insulator 3 is applied to the substrate 1 before pressing the semiconductor particles 2 against the substrate 1 and heating them, and that the insulator 3 is pushed aside while the semiconductor particles 2 are pressed against the substrate 1. In this way, the semiconductor particles 2 can be joined to the substrate 1 without having their upper surfaces covered with the insulator 3 nor being contaminated. Accordingly, mechanical treatments after the joining such as grinding the surfaces of the semiconductor particles 2 are no longer necessary.

Figure 8:
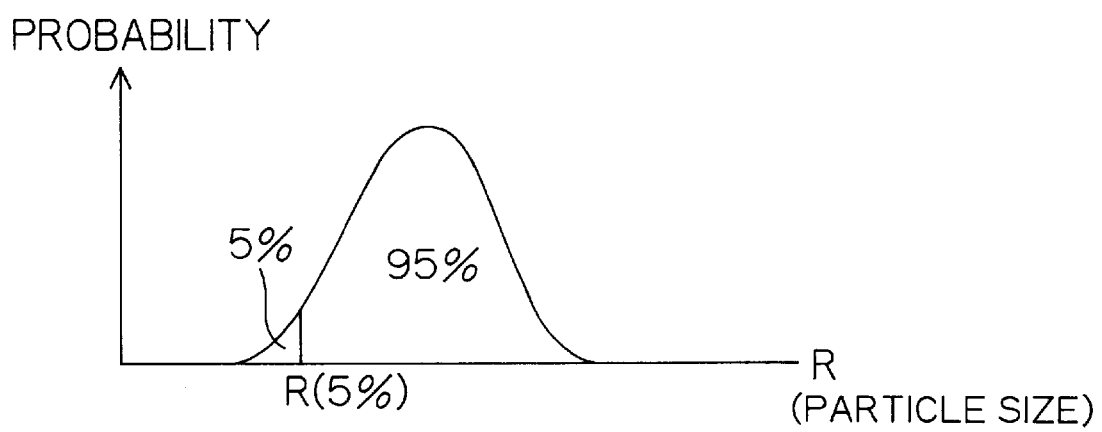
FIG. 8 is a graph showing the particle size distribution of glass particles included in glass paste forming an insulator.
Figure 9:
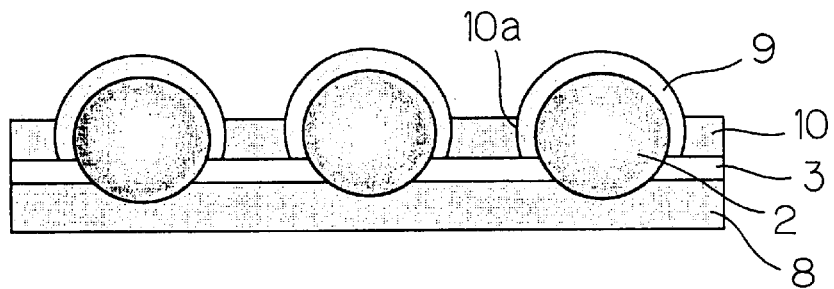
FIG. 9 is a schematic sectional view of a conventional photoelectric conversion device.
Figure 10:
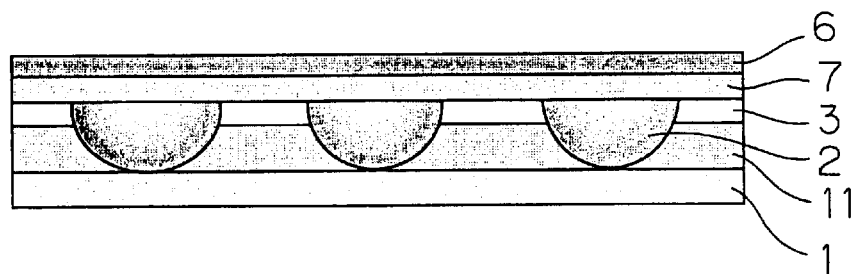
FIG. 10 is a schematic sectional view of a conventional photoelectric conversion device.
Figure 11:
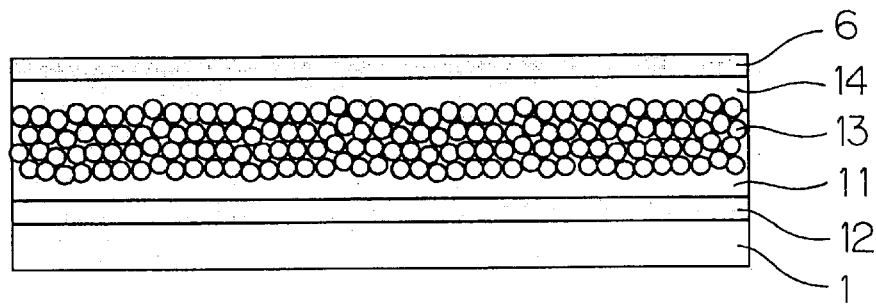
FIG. 11 is a schematic sectional view of a conventional photoelectric conversion device.

FIG. 8 is a graph showing the particle size distribution of glass particles included in glass paste for forming an insulator. In the particle size distribution curve, a particle size at which particles having a particle size not more than that particle size account for 5% of the entire particles is indicated as R(5%). The particle size R(5%) is preferably be selected so as to be in the range of 5 to 25% of the average particle size of the semiconductor particles 2.

When the semiconductor particles 2 are pressed against the substrate 1 so as to be in contact with the substrate 1, glass particles with a particle size R(5%) less than 5% of the average particle size of the semiconductor particles 2 are too small to be ejected from between the substrate 1 and the semiconductor particles 2 so as to be located beside the semiconductor particles 2, and therefore remain between the substrate 1 and the semiconductor particles 2. The remaining glass material makes it impossible to form an ohmic junction between the substrate 1 and semiconductor particles 2.

On the other hand, when the particle size R(5%) exceeds 25% of the average particle size of the semiconductor particles 2, all the glass particles have too large particle sizes to apply the insulator evenly to the substrate.

In order to remedy the problems above, the particle size R(5%) of the glass material is regulated so as to be in the range of 5 to 25% of the average particle size of semiconductor particles. Accordingly, the insulator can be applied on the substrate in a relatively even manner, and when the semiconductor particles 2 are pressed against the substrate, the glass particles are ejected from between the substrate 1 and the semiconductor particles 2 and slide into beside the semiconductor particles 2 so that the substrate 1 and the semiconductor particles 2 can contact with each other, thereby forming an ohmic junction.

Meanwhile, it is also possible to disperse a filler in the insulator 3. The filler is a material that does not melt into the main material when the main material is baked and holds the initial shape, which comprises one or a plurality of materials selected from among $SiO_2$, $Al_2O_3$, CaO, MgO, $TiO_2$, $ZrO_2$, $Si_3N_4$, AlN and the like.

In the particle size distribution curve of a filler, a particle size at which particles having a particle size not more than that particle size account for 5% of the entire particles is indicated as $R_F$ (5%). In order to have a filler contained in such a manner, the particle size $R_F$ (5%) is preferably selected so as to be in the range of 5 to 25% of the average particle size of the semiconductor particles 2. In this way, a similar effect can be attained in the joining even when the particle size R(5%) of the glass material is below 5% of the average particle size of the semiconductor particles 2. This may be explained that the glass particles are ejected together with the filler being ejected.

The conductive layer 4 shown in FIGS. 1 and 2 comprises a second conductivity-type semiconductor conductive layer comprising Si and Ge and/or a transparent conductive layer.

The second conductivity-type semiconductor conductive layer is formed by the vapor phase growth method or the like, in which, for example, a vapor-phase phosphorous system compound that is a n-type impurity or a vapor-phase boron system compound that is a p-type impurity is added in a small amount to a vapor-phase silane compound. The semiconductor layer may be crystalline, amorphous, or mixture of crystalline and amorphous. Since a crystalline conductive layer or a crystalline-amorphous mixed conductive layer has light transmittance higher than that of an amorphous conductive layer, the film thickness thereof can be increased. In addition, since the material used for such a crystalline conductive layer or a crystalline-amorphous mixed semiconductor layer is more stable than that for an amorphous semiconductor layer, they are expected to have higher reliability.

The transparent conductive layer is formed by a film-forming method such as the sputtering technique or the vapor growth method, or paint-and-baking method, in which one or a plurality of compounds selected from among $SnO_2$, $In_2O_3$, ITO, ZnO, $TiO_2$ and the like are used to form an oxide film, or one or a plurality of metals selected from among Ti, Pt, Au and the like are used to form a metal layer. The transparent conductive layer can be expected to have the effect of an antireflection film when the film thickness is selected for such a purpose.

A part of the incident light passes through the conductive layer 4 at areas where the semiconductor particles 2 are not present, and is reflected by the substrate 1 and directed at the semiconductor particles 2. This enables the light energy being transmitted in the whole photoelectric conversion device to be efficiently transmitted to the semiconductor particles 2.

In addition, since the second conductivity-type semiconductor conductive layer 4 also serves as an electrode, it is not necessary to additionally form a transparent conductive film. The manufacturing process is thus simplified allowing further cost reduction. In this sense, a second conductivity-type semiconductor conductive layer is preferred as the conductive layer 4 to be directly formed on the surfaces of the crystalline semiconductor particles 2. If a transparent conductive film is formed as an electrode on defective portions generated during the formation of a second conductivity-type semiconductor conductive layer, leakage will occur between the transparent conductive film and the semiconductor particles 2 located under such defective portions. Also from this point of view, it is preferred that such a transparent conductive film is not formed.

In order to secure good conductivity, the concentration of the microelement in the semiconductor layer 4 is preferably, for example, from $1 \times 10^{16}$ to $1 \times 10^{21}$ atm/cm$^3$.

Furthermore, it is desirable that the second conductivity-type semiconductor conductive layer 4 is formed along the surfaces of the semiconductor particles 2 so that the PN-junction is formed in the vicinity of the surface where the light is incident as well as along the convex contours of the semiconductor particles 2. A wide area is made available for the PN-junction by forming the second conductivity-type semiconductor conductive layer 4 along the convex contours of the semiconductor particles 2 so that carriers generated inside the semiconductor particles 2 can be collected efficiently.

When the semiconductor particles 2 have upper surface regions of which conductivity type is opposite to the conductivity type of their central portions, it is not necessary to form a second conductivity-type semiconductor conductive layer. However, in such a case, a transparent conductive layer needs to be formed as the conductive layer 4.

It is desirable for the protective film 5 to have the properties of a transparent dielectric. It is formed by the CVD method, the PVD method or the like, in which, for example, one or a plurality of materials selected from among silicon oxide, cesium oxide, aluminum oxide, silicon nitride, titanium oxide, SiO$_2$—TiO$_2$, tantalum oxide, yttrium oxide are used to form a single layer or a combined layer on the conductive layer 4. The protective film 5 needs to be a transparent dielectric because transparency is necessary for a protective film being in contact with the surface where the light is incident, and leakage to the semiconductor particles 2 located under defective portions of the conductive layer 4 should be prevented from occurring. Incidentally, optimizing the thickness of the protective film 5 will enable it to function as an antireflection film.

Moreover, it is also possible to provide a patterned electrode comprising fingers and bus bars at regular intervals on the conductive layer 4 or on the protective film 5 so as to lower the series resistance, thereby improving the conversion efficiency.

EXAMPLE 1.1

Now, an example of the present invention is described.

A photoelectric conversion device having the structure shown in FIG. 1 was fabricated. An aluminum layer 1a was formed 50 μm thick on a substrate 1 including iron, on which an insulator 3 was formed such that its thickness after baking was nearly a half the particle size of silicon particles 2.

For the insulator, glass particles of SiO$_2$.B$_2$O$_3$.PbO system mixed with a binder and a solvent were used. Insulators containing a filler were also used in a part of the example.

P-type silicon particles 2 were densely deposited on the insulator 3 and pressed into the insulator 3 until they came into contact with the aluminum layer 1a. The diameter of the p-type silicon particles 2 was varied between two sizes.

Then, heat at a temperature higher than 577° C. was applied so that the insulator 3 was fused and the silicon particles 2 were joined to the aluminum layer 1a.

After carrying out the steps above, the joining condition between the silicon particles 2 and the aluminum layer 1a was checked. A result of the observation is shown in Table 1.

In Table 1, the particle size of the glass particles refers to the aforementioned particle size R(5%), and the particle size of the filler refers to the particle size R$_F$ (5%). The "glass particle size ratio (%)" represents [particle size R(5%)/average particle size of silicon particles].

Samples 1–20 correspond to an embodiment of the present invention.

TABLE 1

| Sample No. | Silicon particle size (mm) | Glass-particle size (μm) | Glass particle size ratio (%) | Filler material | Filler particle size (Mm) | Joined or not? |
|---|---|---|---|---|---|---|
| 1 | 0.98 | 51.1 | 5.2 | — | — | Yes |
| 2 | 0.98 | 62.3 | 6.4 | — | — | Yes |
| 3 | 0.98 | 87.7 | 8.9 | — | — | Yes |
| 4 | 0.98 | 102.2 | 10.4 | — | — | Yes |
| 5 | 0.98 | 205.1 | 20.9 | — | — | Yes |
| 6 | 0.98 | 241.2 | 24.6 | — | — | Yes |
| 7 | 0.98 | 51.1 | 5.2 | SiO2 | 51.1 | Yes |
| 8 | 0.98 | 51.1 | 5.2 | Al2O3 | 51.1 | Yes |
| 9 | 0.98 | 51.1 | 5.2 | CaO | 51.1 | Yes |
| 10 | 0.98 | 51.1 | 5.2 | MgO | 51.1 | Yes |
| 11 | 0.98 | 51.1 | 5.2 | TiO2 | 51.1 | Yes |
| 12 | 0.98 | 51.1 | 5.2 | Steatite | 51.1 | Yes |
| 13 | 0.98 | 51.1 | 5.2 | Zircon | 51.1 | Yes |
| 14 | 0.98 | 51.1 | 5.2 | Cordierite | 51.1 | Yes |
| 15 | 0.98 | 62.3 | 6.4 | SiO2 | 62.3 | Yes |
| 16 | 0.98 | 241.2 | 24.6 | SiO2 | 241.2 | Yes |
| 17 | 0.68 | 35.4 | 5.2 | — | — | Yes |
| 18 | 0.68 | 44.0 | 6.5 | — | — | Yes |
| 19 | 0.68 | 145.5 | 21.4 | — | — | Yes |
| 20 | 0.68 | 176.0 | 25.8 | — | — | Yes |
| 21 | 0.98 | 4.2 | 0.04 | — | — | No |
| 22 | 0.98 | 35.4 | 3.6 | — | — | No |
| 23 | 0.98 | 44.0 | 4.5 | — | — | No |
| 24 | 0.98 | 290.8 | 29.7 | — | — | Yes |
| 25 | 0.98 | 290.8 | 29.7 | SiO2 | 290.8 | Yes |
| 26 | 0.68 | 4.2 | 0.06 | — | — | No |
| 27 | 0.68 | 30.3 | 4.5 | — | — | No |
| 28 | 0.68 | 205.1 | 80.2 | — | — | Yes |

In the samples 21–23 where silicon particles 2 having particle size of 0.98 mm were used, the glass particle size ratios were below 5%. In these samples, when the silicon particles 2 were pressed, the glass particles between the aluminum layer 1a and the silicon particles 2 were not thoroughly ejected and remained between the aluminum layer 1a and the silicon particles 2, therefore the joining was impossible.

In the cases of samples 24 and 28 where the glass particle size ratios exceeded 25%, the glass particles were ejected from between the aluminum layer 1a and the silicon particles 2, and the joining was accomplished. However, due the excessively large particle size of the glass particles, the coating of the insulator 3 was not evenly formed.

As for the samples 1–6 where the glass particle size ratios were within the range of 5 to 25%, the coating of the insulator 3 was evenly formed, as well as the glass particles were ejected from between the aluminum layer 1a and the silicon particles 2 to be located beside the silicon particles 2 in each case, so that they had good joining conditions.

The samples 7–16, each of which included a filler whose particle size R$_F$ was in the range of 5 to 25% of the average particle size of the silicon particles 2, had good joining conditions similarly to the samples 1–6.

The coating of the insulator was not evenly formed in the sample 25 similarly to the sample 24.

In the cases of the samples 26 and 27 where silicone particles with a particle size of 0.68 mm were used, the glass particles between the aluminum layer 1a and the silicon particles 2 were not thoroughly ejected and the joining conditions were not good similarly to the samples. 21–23.

On the other hand, in the samples 17–20 where silicon particles 2 having a particle size of 0.68 mm were used, the coating of the insulator 3 was evenly formed, as well as the glass particles were ejected from between the aluminum layer 1a and the silicon particles 2 to be located beside the silicon particles 2, they therefore had good joining conditions as in the samples 1–6.

It has been understood from the results above that preferred particle size R(5%) of the glass particles and the particle size $R_F$ (5%) of the filler are in the range of 5 to 25% of the average particle size of the silicon particles 2.

Incidentally, the same effect was observed in the case of using a single-layered substrate including aluminum (See FIG. 2.) for the substrate 1.

EXAMPLE 1.2

Furthermore, in order to find out relation between the particle size of glass particles and that of filler, each sample listed in Table 2 was checked out in terms of rate of successful joining, in which 50 silicon particles 2 were used.

of the glass particles is less than 5% as long as the particle size ratio of the filler is more than 5%.

2. Second Embodiment

The structure of a photoelectric conversion device according to the second embodiment of the present invention is shown in FIGS. 1 and 2. A substrate 1, a conductive layer 1a, a first conductivity-type semiconductor particles 2, a conductive layer 4, and a protective film 5 shown in FIGS. 1 and 2 correspond to those in the first embodiment. Explanation of these is therefore omitted.

Also, in the same manner as explained referring to the first embodiment, the insulator 3 is applied to the substrate 1 before pressing the semiconductor particles 2 against the substrate 1 and heating them, the fused insulator 3 is pushed aside when the semiconductor particles 2 are pressed against the substrate 1 so as to form an ohmic junction between the substrate 1 and the semiconductor particles 2, and the fused insulator 3 forms an insulator layer 3 so as to partially cover the semiconductor particles 2 in this embodiment.

Unlike in the first embodiment, it is essential for the insulator 3 to include a filler in this second embodiment. The main material of the insulator 3 comprises, for example, $SiO_2$, $B_2O_3$, $Al_2O_3$, CaO, MgO, $P_2O_5$, $Li_2O$, SnO, PbO, ZnO, BaO and the like. A paste of glass particles comprising one or a plurality of these materials as the main component is used.

The filler does not melt into the main material holding its initial shape when the main material is baked, and comprises one or a plurality of materials such as $SiO_2$, $Al_2O_3$, CaO, MgO, $TiO_2$, $ZrO_2$, $Si_3N_4$, AlN and the like.

The relation between the glass particles and the filler is hereinafter described.

TABLE 2

| Sample No. | Silicon particle size (mm) | Glass-particle size (μm) | Glass particle size ratio (%) | Filler material | Filler particle size (μm) | Filler particle size ratio (%) | Rate of successful joining (%) |
|---|---|---|---|---|---|---|---|
| 7 | 0.98 | 51.1 | 5.2 | SiO2 | 51.1 | 5.2 | 100 |
| 29 | 0.98 | 30.3 | 4.5 | SiO2 | 62.3 | 6.4 | 92 |
| 30 | 0.98 | 4.2 | 0.06 | SiO2 | 51.1 | 5.2 | 74 |
| 31 | 0.98 | 4.2 | 0.06 | SiO2 | 30.3 | 4.5 | 8 |
| 23 | 0.98 | 44.0 | 4.5 | — | — | — | 28 |

In Table 2, the "filler particle size ratio (%)" refers to [filler particle size $R_F$ (5%)/average particle size of silicone particles].

The rate of successful joining was 100% in the sample 7, while it was over 60% in each of the samples 29 and 30. The reason for this is considered that even when the glass particles were small, as long as the filler particles were large, the glass particles were ejected along with the filler being ejected from between the aluminum layer 1a and the silicon particles 2 to be located beside the silicon particles 2 when the silicon particles 2 were pressed against the aluminum layer 1a.

Meanwhile, in the case of the sample 23 including only glass particles whose particle size ratio was below 5%, the rate of successful joining was 28%, which meant that ejection of the glass particles from between the aluminum layer 1a and the silicon particles 2 was insufficient.

In the sample 31 where the particle size ratio of the glass particles and that of the filler were both below 5%, the rate of successful joining was the lowest 8%, which revealed that ejection of the glass particles from between the aluminum layer 1a and the silicon particles 2 was insufficient.

Figure 3A:
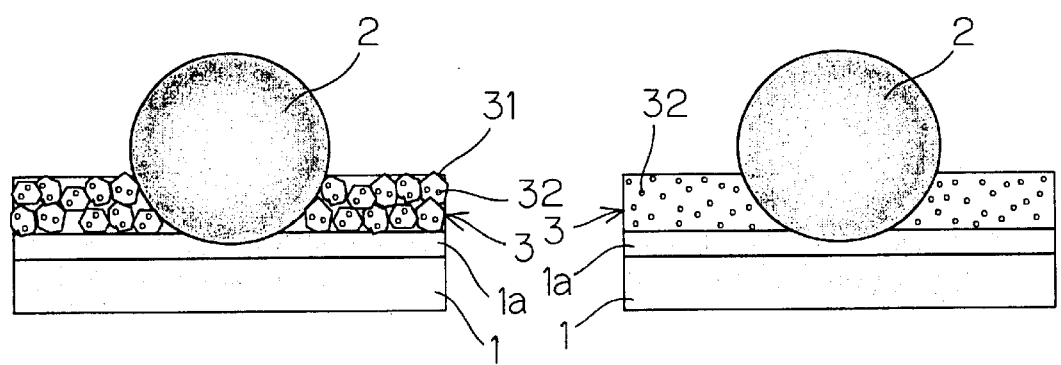
FIG. 3A is a schematic sectional view showing partially a photoelectric conversion device according to the present invention when a semiconductor particle is pressed against a substrate before an insulator layer is baked.
Figure 3B:
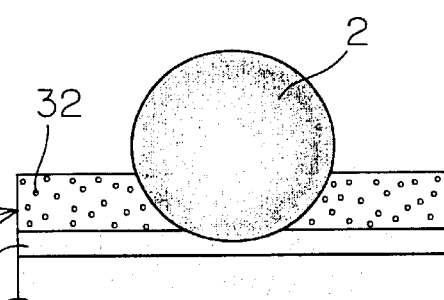
FIG. 3B is a schematic sectional view showing partially the photoelectric conversion device according to the present invention after the insulator layer has been baked.

Accordingly, it has been understood that the effect on the joining can still be expected even when the particle size ratio FIG. 3A is a schematic sectional view showing partially a photoelectric conversion device when a semiconductor particle 2 is pressed against a substrate 1 before an insulator 3 is baked, and FIG. 3B is a schematic sectional view of the same after the insulator 3 has been baked. Glass particles are denoted by 31, and filler particles dispersed within the glass particles are denoted by 32.

The filler particles 32 having a particles size smaller than that of the glass particles 31 are baked together with the main material and then crushed so as to form glass particles 31 having the filler particles 32 dispersed therein.

By using such glass particles 31, when the semiconductor particle 2 is pressed against the substrate 1 so as to be contacted therewith, the glass particles 31 are ejected from between the substrate 1 and the semiconductor particle 2 to be located beside the semiconductor particle 2 enabling ohmic junction to be formed at the temperature of baking carried out thereafter. In addition, since the glass particles 31 melt at the baking temperature, the filler particles 32 that have been dispersed within the glass particles 31 are evenly dispersed inside the insulator layer 3 (See FIG. 3B). This reduces unevenness in thermal expansion coefficient, thereby preventing the semiconductor particle 2 from cracking due to stress.

;When an insulator 3 is formed by mixing glass particles 31 without including a filler with filler particles 32 having a particle size smaller than that of the glass particles 31 as shown in FIG. 4A, due to the too small particle size of the filler, there are cases where the filler particles 32 are not thoroughly ejected from between the substrate 1 and the semiconductor particles 2 to be located beside the semiconductor particles 2 and remain between the substrate 1 and the semiconductor particles 2, hindering the substrate 1 from contacting with the semiconductor particles 2 (Refer to FIG. 4B).

Meanwhile, when the particle size $R_F$ (5%) of the filler is 10 μm or less, unevenness in thermal expansion coefficient is reduced. However, when it exceeds 10 μm, cracks 6 are generated in the semiconductor particles 2 due to stress caused by unevenness in thermal expansion coefficient.

As shown in 5A, when an insulator 3 is formed by mixing glass particles 33 with filler particles 34 having a particle size as large as that of glass particles 33, unevenness in thermal expansion coefficient is generated after baking, which causes semiconductor particles 2 to have cracks 6 due to stress (See FIG. 5B)

EXAMPLE 2

Now, another example of the photoelectric conversion device according to the present invention is described.

A photoelectric conversion device as shown in FIG. 1 was fabricated. A 50 m thick aluminum layer 1a was formed on a substrate 1 including iron, to which an insulator 3 was applied such that the thickness thereof after baking became nearly a half of the particle size of the silicon particles 2.

For the insulator 3, glass particles of $Sio_2.B_2O_3.PbO$ system mixed with a binder and a solvent were used. The material for the insulator 3 was varied according to the case.

Regarding the manner of mixing a filler, a manner in which fine particles of a filler are dispersed within glass particles is referred to as "within particles", while a manner in which a filler is dispersed outside glass particles is referred to as "outside particles".

P-type silicon particles 2 were densely disposed on the insulator 3 and pressed into the insulator 3 so as to be contacted with the aluminum layer 1a. The diameter of the p-type silicon particle 2 was varied between two sizes.

Then, heat at a temperature higher than 577° C. was applied so that the insulator 3 was fused and the silicon particles 2 were joined to the aluminum layer 1a.

After going through the steps above, the joining condition between the silicon particles 2 and the aluminum layer 1a, and cracking due to stress in the silicon particles 2 were checked. A result of the observation is shown in Table 3. Samples 41–63 correspond to an embodiment of the present invention.

TABLE 3

A: Filler dispersion (IN: Within particles, OUT: Outside particles) B: Joined or not C: Cracking in silicon particles

| Sample No. | Silicon particle size (mm) | Glass-particle size (μm) | Glass particle size ratio (%) | Filler material | Filler particle size (μm) | A | B | C |
|---|---|---|---|---|---|---|---|---|
| 41 | 0.98 | 51.1 | 5.2 | Al2O3 | 4.2 | IN | Yes | No |
| 42 | 0.98 | 62.3 | 6.4 | Al2O3 | 4.2 | IN | Yes | No |
| 43 | 0.98 | 87.7 | 8.9 | Al2O3 | 4.2 | IN | Yes | No |
| 44 | 0.98 | 102.2 | 10.4 | Al2O3 | 4.2 | IN | Yes | No |
| 45 | 0.98 | 205.1 | 20.9 | Al2O3 | 4.2 | IN | Yes | No |
| 46 | 0.98 | 241.2 | 24.8 | Al2O3 | 4.2 | IN | Yes | No |
| 47 | 0.98 | 51.1 | 5.2 | Al2O3 | 1.1 | IN | Yes | No |
| 48 | 0.98 | 51.1 | 5.2 | Al2O3 | 9.7 | IN | Yes | No |
| 49 | 0.98 | 51.1 | 5.2 | SiO2 | 3.3 | IN | Yes | No |
| 50 | 0.98 | 51.1 | 5.2 | CaO | 2.8 | IN | Yes | No |
| 51 | 0.98 | 51.1 | 5.2 | MgO | 4.5 | IN | Yes | No |
| 52 | 0.98 | 51.1 | 5.2 | TiO2 | 4.3 | IN | Yes | No |
| 53 | 0.98 | 51.1 | 5.2 | Si3N4 | 4.0 | IN | Yes | No |
| 54 | 0.98 | 51.1 | 5.2 | AlN | 4.1 | IN | Yes | No |
| 55 | 0.98 | 51.1 | 5.2 | Steatite | 5.1 | IN | Yes | No |
| 56 | 0.98 | 51.1 | 5.2 | Zircon | 3.1 | IN | Yes | No |
| 57 | 0.98 | 51.1 | 5.2 | Cordierite | 5.3 | IN | Yes | No |
| 58 | 0.68 | 35.4 | 5.2 | Al2O3 | 4.2 | IN | Yes | No |
| 59 | 0.68 | 44.0 | 6.5 | Al2O3 | 4.2 | IN | Yes | No |
| 60 | 0.68 | 145.5 | 21.4 | Al2O3 | 4.2 | IN | Yes | No |
| 61 | 0.68 | 176.0 | 25.3 | Al2O3 | 4.2 | IN | Yes | No |
| 62 | 0.68 | 44.0 | 6.5 | Al2O3 | 1.1 | IN | Yes | No |
| 63 | 0.68 | 44.4 | 6.5 | Al2O3 | 9.7 | IN | Yes | No |
| 64 | 0.98 | 51.1 | 5.2 | Al2O3 | 4.2 | OUT | No | No |
| 65 | 0.98 | 51.1 | 5.2 | Al2O3 | 51.1 | OUT | Yes | Yes |
| 66 | 0.98 | 35.4 | 3.6 | Al2O3 | 4.2 | IN | No | No |
| 67 | 0.98 | 44.0 | 4.5 | Al2O3 | 4.2 | IN | No | No |
| 68 | 0.98 | 290.8 | 29.7 | Al2O3 | 4.2 | IN | No | No |
| 69 | 0.98 | 51.1 | 5.2 | Al2O3 | 12.2 | IN | Yes | Yes |
| 70 | 0.68 | 35.4 | 5.2 | Al2O3 | 4.2 | OUT | No | No |
| 71 | 0.68 | 35.4 | 5.2 | Al2O3 | 35.4 | OUT | Yes | Yes |
| 72 | 0.68 | 30.3 | 4.5 | Al2O3 | 4.2 | IN | No | No |
| 73 | 0.68 | 205.1 | 30.2 | Al2O3 | 4.2 | IN | No | No |
| 74 | 0.68 | 44.0 | 6.5 | Al2O3 | 12.2 | IN | Yes | Yes |

In the samples 66 and 67 where silicon particles 2 having a particle size of 0.98 mm were used, the glass particle size ratios R (5%) were below 5% of the average particle size of the silicon particles 2. In these samples, when the silicon particles 2 were pressed, the glass particles were not thoroughly ejected and remained between the aluminum layer 1a and the silicon particles 2, for which joining was impossible.

In the case of the sample 68 where the glass particle size ratio exceeded 25%, the glass particles were ejected from between the aluminum layer 1a and the silicon particles 2, and joining was accomplished. However, due to the excessively large particle size of the glass particles, the coating of the insulator 3 was not evenly formed.

As for the samples 41–46 where the glass particle size ratios were within the range of 5 to 25%, the coating of the insulator 3 was evenly formed, as well as the glass particles were ejected from between the aluminum layer 1a and the silicon particles 2 to be located beside the silicon particles 2, so that they had good joining conditions (FIG. 3B).

In the samples 49–57 each of which included a filler whose particle size ratio was within the range of 5 to 25%, the joining conditions were as good as those in the samples 41–46.

In the case of the sample 64 where fine particles of a filler were dispersed outside the glass particles, the filler particles were not thoroughly ejected and remained between the aluminum layer 1a and the silicon particles 2, for which the joining condition was not good (See FIG. 4B).

As for the sample 65 where filler particles having a particle size as large as that of the glass particles were used, the glass particles and filler particles were ejected from between the aluminum layer 1a and the silicon particles 2 to be located beside the silicon particles 2, so that the joining condition was good. However, cracks 6 were generated in the silicon particles 2 after the baking (See FIG. 5B). This may be explained that unevenness was generated in thermal expansion coefficient of the insulator due to the large filler particles, which generated stress that caused generation of the cracks.

In the cases of the samples 70 and 72 where silicone particles with a particle size of 0.68 mm were used, the glass particles or the filler particles were not thoroughly ejected and remained between the aluminum layer 1a and the silicon particles 2 as in the samples 64, 66, and 67, for which joining was impossible (FIG. 4B).

In the sample 73 where the particle size ratio of the glass particles exceeded 25%, due to the too large particle size, the coating of the insulator was not evenly formed similarly to the case of sample 68.

As for the samples 58–61, similarly to the samples 41–46, the coating of the insulator was formed in a relatively even manner as well as the glass particles were ejected from between the aluminum layer 1a and the silicon particles 2 to be located beside the silicon particles 2, by which joining was accomplished in a good condition in each of the samples (See FIG. 3B).

In the case of the sample 71 where filler particles having a particle size as large as that of the glass particles were used, although joining was accomplished in a good condition, cracks 6 were generated in the silicon particles 2 after the baking as in the case of the sample 65 (See FIG. 5B).

When the particle size $R_F$ (5%) of the filler to be dispersed within the glass particles was below 10 $\mu$m as in the samples 47, 48, 62, and 63, cracking did not occur in the silicon particles 2 after the baking and joining was accomplished in a good condition. However, when the particle size $R_F$ (5%) exceeded 10 $\mu$m as in the samples 69 and 74, cracking occurred in the silicon particles 2, although it was little.

The above-described results have revealed that a good joining condition can be obtained when the particle size R(5%) of the glass particles is in the range of 5 to 25% of the average particle size of the silicon particles 2, and that by dispersing a filler comprising fine particles whose particle size $R_F$ (5%) is less than 10 $\mu$m within the glass particles, generation of unevenness in thermal expansion coefficient is reduced so that cracking is prevented from occurring in the silicon particles 2.

Incidentally, similar effects were observed when a single-layered substrate comprising aluminum (FIG. 2) was used.

3. Third Embodiment

FIGS. 6 and 7 illustrate photoelectric conversion devices according to the third embodiment of this invention.

In FIGS. 6 and 7, the numerals denote parts as follows: 1: substrate, 1a: conductive layer, 2: crystalline semiconductor particle, 3: insulator comprising glass material, 4: semiconductor layer, 5: protective layer, 15: joint between the substrate 1 and the crystalline semiconductor particle 2

The substrate 1 comprises metal, ceramics or resin. When the substrate 1 comprises an insulator such as ceramics or resin, a conductive layer 1a needs to be formed on the substrate 1 as shown in FIG. 7. When metal is used for the substrate 1, the substrate 1 is formed as a single metal layer or a combined layer comprising different kinds of metal layers.

The crystalline semiconductor particles 2 comprise Si, Ge, and a small amount of a p-type impurity such as B, Al, and Ga, or a n-type impurity such as P, As, and the like added thereto. The alloy portion 15 is formed in such a manner that with the substrate 1 and the crystalline semiconductor particles 2 being in contact with each other, baking is carried out at a temperature higher than 577° C., which is the eutectic temperature of Al and Si. The alloy portion 15 is a region where Al, the material of the substrate 1, and the material of the crystalline semiconductor particle 2 in the part being in contact with the substrate 1 melt together. In the first conductive-type region in contact with the alloy portion 15, Al, the material of the substrate 1, is diffused, and a highly concentrated impurity layer (for example, p+ layer) is formed.

When forming a conductive diffusion region is simply aimed at, it is achieved by heating at a temperature below 577° C., which is the eutectic temperature of Al and Si. However, in such a case, the connection between the substrate 1 and the crystalline semiconductor particles 6 is so weak that the crystalline semiconductor particles 6 leave the substrate 1, which makes it impossible for the device to maintain the structure as a solar cell.

The particle sizes of the crystalline semiconductor particles 2 may be even or uneven. However, uneven particle sizes will be advantageous to make the device less expensive, because an additional process is necessary in order to uniformize the particle sizes. In addition, providing the crystalline semiconductor particles 2 with convex surfaces reduces dependence on the light incidence angle.

Preferably, the particle size of the particles 2 should be in the range of 10–500 $\mu$m. At particle sizes less than 10 $\mu$m, the crystalline semiconductor particles 2 completely melt when joined to the substrate 1, thus causing leakage between the particles 2 and the semiconductor layer 4 disposed thereon. Also, using semiconductor particles with diameters exceeding 500 $\mu$m makes no difference in the amount of the semiconductor material to be used from the amount used in conventional flat plate photoelectric conversion devices, which neutralizes the material-saving advantage of using spherical particles.

The crystalline semiconductor particle 2 may comprise a peripheral portion comprising a small amount of a p-type impurity such as B, Al, and Ga or a n-type impurity such as P, As and the like.

The insulator 3 comprises an insulating material for separating the positive electrode from the negative electrode. The characteristics of the insulating material should be such that the thermal expansion coefficient is from $30 \times 10^{-7}/°C$. to $60 \times 10^{-7}/°C$. and the softening point is below 500° C. When the thermal expansion coefficient is below $30 \times 10^{-7}$, the difference in thermal expansion coefficient between the insulator and the substrate comprising aluminum (the thermal expansion coefficient of aluminum: $240 \times 10^{-7}/°C$.) is so great that cracks are generated in the surface of the insulator 3 after the formation thereof. When the thermal expansion coefficient exceeds $60 \times 10^{-7}/°C$., the difference in thermal expansion coefficient between the insulator and the crystalline semiconductor particles 2 (for example, the thermal expansion coefficient of Si is $26 \times 10^{-7}/°C$.) is so great that cracks are generated in the crystalline semiconductor particles 2 and the insulator 3 around them. Regarding the softening point, it is necessary for the insulator not to melt or be decomposed at the temperature for forming the semiconductor layer. In addition, when the softening point exceeds 500° C., the insulating material does not melt at a temperature around 577° C., which is the temperature for joining the substrate 1 to the crystalline semiconductor particles 2, and defects such as voids are generated, so that the insulator fails to cover the exposed surface of the substrate 1 and is unable to function as an insulator. Accordingly, the softening point should preferably be in the range of 200–500° C. in consideration of the temperature for forming an amorphous semiconductor layer, and more desirably, it should be in the range of 350–500° C. in consideration of the temperature for forming a semiconductor layer comprising a mixture of amorphous and crystalline semiconductors.

The material for the insulator 3 may be of any kind that satisfies above mentioned conditions, which is, for example, a single glass material for low-temperature firing mainly comprising materials selected arbitrarily from among $SiO_2$, $B_2O_3$, $Al_2O_3$, CaO, MgO, $P_2O_5$, $Li_2O$, $SnO_2$, PbO, ZnO, BaO, $TiO_2$ and the like, or a material having a filler combined therewith in which the filler comprises one or a plurality of the materials listed above. The insulator 3 may be formed simultaneously with the joining of the numerous crystalline semiconductor particles 2 deposited on the substrate 1 to the substrate 1, or after the joining. Or, the surface after the formation of the insulator may be treated by etching or the like.

The semiconductor layer 4 comprises, for example, Si, and is formed by the vapor growth method in which a vapor-phase phosphorous system compound that is a n-type impurity or a vapor-phase boron system compound that is a p-type impurity is added in a small amount to a vapor-phase silane compound. The semiconductor may be crystalline, amorphous, or mixture of crystalline and amorphous. However, in view of light transmittance, the semiconductor should preferably be crystalline or mixture of crystalline and amorphous. Concerning the light transmittance, a part of the incident light passes through the semiconductor layer 4 at areas where the crystalline semiconductor particles 3 are not present, and is reflected by the substrate 1 located below the layer and directed at the semiconductor particles 2 so that the light energy being transmitted in the whole photoelectric conversion device is efficiently transmitted to the crystalline semiconductor particles 2.

Regarding the conductivity, the concentration of the microelement in the semiconductor layer 4 may be high, which is, for example, from $1 \times 10^{16}$ to $1 \times 10^{21}$ atm/cm$^3$.

In addition, the semiconductor layer 4 is preferably formed along the surfaces of the crystalline semiconductor particles 2 as well as along the convex contours of the crystalline semiconductor particles 2. A wide area is made available for the PN-junction by forming the semiconductor layer 4 along the convex contours of the crystalline semiconductor particles 2 so that carriers generated inside the crystalline semiconductor particles 2 can be collected efficiently. Incidentally, when the crystalline semiconductor particles 2 comprise peripheral portions including a n-type impurity such as P and As, or a p-type impurity such as B, Al, and Ga, the semiconductor layer 4 may be omitted and instead, a transparent conductive layer that is mentioned later may be formed over the semiconductor particles.

A transparent conductive layer, which serves as the electrode of the other side, may be formed on the semiconductor layer 4. It is formed by a film-forming method such as the sputtering technique or the vapor growth method, or paint-and-baking method, in which one or a plurality of compounds selected from among $SnO_2$, $In_2O_3$, ITO, ZnO, $TiO_2$ and the like are used to form an oxide film, or one or a plurality of metals selected from among Ti, Pt, Au and the like are used to form a metal film. The transparent conductive layer can be expected to have the effect of an antireflection film when the film thickness is selected for such a purpose. Meanwhile, it is necessary for the transparent conductive layer to be transparent so that a part of the incident light passes through the transparent conductive layer at areas where the crystalline semiconductor particles 2 are not present and reflected by the substrate 1 and directed to the crystalline semiconductor particles 2. This enables the light energy being transmitted in the whole photoelectric conversion device to be efficiently transmitted to the crystalline semiconductor particles 2. Furthermore, the transparent conductive layer should preferably be formed along the surface of the semiconductor layer 4 or the surfaces of the crystalline semiconductor particles 2 as well as along the convex contours of the crystalline semiconductor particles 2. A wide area will be made available for the PN-junction by forming the transparent conductive layer along the convex contours of the crystalline semiconductor particles 2 so that carriers generated within the crystalline semiconductor particles 2 can be collected efficiently.

Also, it is possible to form a protective layer 5 on the semiconductor layer 4 or the transparent conductive layer. It is desirable for the protective layer 5 to have the properties of a transparent dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the semiconductor layer 4 or the conductive layer 6. The protective layer 5 needs to be transparent because it is in contact with the surface where the light is incident. Also, the protective layer 5 needs to be a dielectric for preventing leakage from occurring between the semiconductor layer 4 or the conductive layer 6 and the outside thereof. Incidentally, optimizing the thickness of the protective layer 5 will enable it to function as an antireflection film.

Moreover, in order to lower the series resistance, it is also possible to provide a patterned electrode (the other electrode) comprising fingers and bus bars at regular intervals on the semiconductor layer 4 or on the conductive layer 6 so as to directly or indirectly connect it to the semiconductor layer 4, thereby improving the conversion efficiency.

EXAMPLE 3

Samples 81–91 were prepared by the following procedure.

A 50 μm thick aluminum layer 1a was formed on a substrate 1 including iron. An insulator 3 was formed by using a single glass material for low-temperature firing mainly comprising a material selected arbitrarily from among $SiO_2$, $B_2O_3$, $Al_2O_3$, CaO, MgO, $P_2O_5$, $Li_2O$, $SnO_2$, PbO, ZnO, BaO, $TiO_2$ and the like, or pasted glass particles having a filler combined therewith that comprised one or a plurality of materials listed above, and was applied to the aluminum layer 1a such that the thickness of the insulator 3 after baking became nearly a half of the particle size of the silicon particles 2.

P-type silicon particles 2 whose major particle size was 250 μm were densely deposited on the insulator 3 and pressed thereinto until they came into contact with the aluminum layer 1a. Then, heat at a temperature in the vicinity of 577° C. was applied so that the insulator was fused and the silicon particles 2 were joined to the aluminum layer 1a.

Through the steps above, samples were fabricated (five pieces for each) by varying the material of the insulator 3, and whether cracking due to stress occurred in the silicon particles 2 or the insulator 3, and the melting state of the insulator 3 were checked. The result is shown in Table 4. Samples 81–88 correspond to an embodiment of this invention.

TABLE 4

| Sample No. | Thermal expansion coefficient ($\times 10^{-7}$/° C.) | Softening point (° C.) | Generation of cracks | Melting state of insulator |
|---|---|---|---|---|
| 81 | 32 | 410 | None | Melted |
| 82 | 41 | 390 | None | Melted |
| 83 | 51 | 390 | None | Melted |
| 84 | 60 | 398 | None | Melted |
| 85 | 56 | 353 | None | Melted |
| 86 | 54 | 450 | None | Melted |
| 87 | 51 | 490 | None | Melted |
| 88 | 41 | 390 | None | Melted |
| 89 | 28 | 450 | Generated all over the insulator | Melted |
| 90 | 65 | 400 | Generated around the silicon particles | Melted |
| 91 | 47 | 515 | None | Not melted |

The samples 81–84, 89 and 90 are ones in which the thermal expansion coefficient of the insulator 3 was varied.

In the sample 89, although the insulator 3 was fused, it had cracks in the whole surface. This may be explained that the insulator 3 had a thermal expansion coefficient of less than $30 \times 10^{-7}$/°C., which differed from the thermal expansion coefficient of the aluminum ($240 \times 10^{-7}$/°C.) used for the substrate so greatly that cracking occurred after the formation of the insulator. Such cracking causes leakage to occur, which is a problem in terms of reliability.

The sample 90 had cracking generated around the silicon particles 2. The cause of this is considered that the thermal expansion coefficient of the insulator exceeding $60 \times 10^{-7}$/°C. differed from the thermal expansion coefficient of the silicon particles 2 ($26 \times 10^{-7}$/°C.) so greatly that cracking occurred after the formation of the insulator.

On the other hand, no cracking occurred in the samples 81–84 and the glass particles melted so that an insulator film was duly formed. The results shown above have revealed that the thermal expansion coefficient of the insulator should preferably be in the range of $30 \times 10^{-7}$/°C. to $60 \times 10^{-7}$/°C.

In the samples 85–87, and 91, the softening point of the insulator 3 was varied. In the sample 91, the glass particles did not completely melt at the baking temperature in the vicinity of 577° C. for joining the silicon particles 2 to the aluminum layer 1a, and voids were generated. This is considered to be caused by the too high softening point of the insulator exceeding 500° C. On the other hand, in the samples 85–87, the glass particles melted and an insulator film was formed without generation of voids or cracks. From the results above, it has been understood that the softening point of the insulator is preferably below 500° C.

Meanwhile, the sample 88 was made as follows: A 50 μm thick aluminum layer 1a was formed on a substrate 1 including iron, on which p-type silicon particles 2 whose major particle size was 250 μm were densely deposited. Then, heat at a temperature in the vicinity of 577° C., which is the eutectic temperature of Al and Si, was applied so as to join the substrate 1 to the p-type silicon particles 2. Subsequently, clearances among the silicon particles 2 were filled with glass particles whose thermal expansion coefficient and softening point were in the aforementioned ranges, and baking was carried out at a temperature below the temperature at which the substrate 1 and the p-type silicon particles 2 are joined together, thereby forming an insulator 3. In this sample, the insulator film was successfully formed with the glass particles being melted without generation of voids, and no cracking occurred.

From the discussion so far, it has been confirmed that a good insulator that is prevented from having defects such as cracks and voids can be formed by the photoelectric conversion device according to the present invention.

What is claimed is:

1. A method of manufacturing a photoelectric conversion device comprising the steps of:
    applying numerous glass particles having a particle size before baking being 5 to 25% of that of crystalline semiconductor particles to a substrate having an electrode on one side so as to form a layer of glass particles;
    depositing the crystalline semiconductor particles on the layer of the glass particles;
    pressing the crystalline semiconductor particles against the substrate; and
    subjecting at least the glass particles and the semiconductor particles to baking, thereby manufacturing a photoelectric conversion device in which the crystalline semiconductor particles and the substrate are in contact together and a glass insulator is interposed among the crystalline semiconductor particles.

2. The method of manufacturing a photoelectric conversion device according to claim 1, wherein the particle size of the glass particles is R(5%), which is a particle size in a particle size distribution curve of the glass particles at which particles having a particle size not more than said particle size account for 5% of the entire particles.

3. The method of manufacturing a photoelectric conversion device according to claim 1, wherein the particle size of the crystalline semiconductor particles is the average particle size in a particle size distribution curve of the crystalline semiconductor particles.

4. A method of manufacturing a photoelectric conversion device according to claim 1, wherein said glass particles are composed of a plurality of glass materials having a thermal expansion coefficient in the range of $30 \times 10^{-7}/°C$ to $60 \times 10^{-7}/°C$, and a softening point of 500° C. or below.

5. A photoelectric conversion device comprising:
   a substrate having an electrode on one side;
   numerous crystalline semiconductor particles deposited on the substrate; and
   an insulator interposed among the crystalline semiconductor particles,
   wherein the insulator is formed by baking a layer of glass particles that has been applied to the substrate, the insulator further comprising a filler having a particle size being 5 to 25% of that of the crystalline semiconductor particles.

6. The photoelectric conversion device according to claim 5, wherein the particle size of the filler is $R_F$ (5%), which is a particle size in a particle size distribution curve of the filler at which particles having a particle size not more than said particle size account for 5% of the entire particles.

7. The photoelectric conversion device according to claim 5, wherein the particle size of the crystalline semiconductor particles is the average particle size in a particle size distribution curve of the crystalline semiconductor particles.

8. A method of manufacturing a photoelectric conversion device comprising the steps of:
   applying numerous glass particles including a filler dispersed therein to a substrate having an electrode on one side so as to form a layer of glass particles;
   depositing crystalline semiconductor particles on the layer of the glass particles;
   pressing the crystalline semiconductor particles against the substrate; and
   subjecting at least the glass particles and the semiconductor particles to baking, whereby manufacturing a photoelectric conversion device in which the crystalline semiconductor particles and the substrate are in contact together and an insulator comprising glass and the filler is interposed among the crystalline semiconductor particles.

9. The method of manufacturing a photoelectric conversion device according to claim 8, wherein the filler comprises one or a plurality of materials selected from the group consisting of $SiO_2$, $Al_1O_3$, CaO, MgO, $TiO_2$, $ZrO_2$, $Si_3N_4$, and AlN.

10. The method of manufacturing a photoelectric conversion device according to claim 8, wherein the particle size of the glass particles before baking is 5 to 25% of that of the crystalline semiconductor particles.

11. The method of manufacturing a photoelectric conversion device according to claim 10, wherein the particle size of the glass particles is R (5%), which is a particle size in a particle size distribution curve of the glass particles at which particles having a particle size not more than said particle size account for 5% of the entire particles.

12. The method of manufacturing a photoelectric conversion device according to claim 10, wherein the particle size of the crystalline semiconductor particles is the average particle size in a particle size distribution curve of the crystalline semiconductor particles.

13. The method of manufacturing a photoelectric conversion device according to claim 8, wherein the particle size of the filler is 10 μm or less.

14. The method of manufacturing a photoelectric conversion device according to claim 13, wherein the particle size of the filler is $R_F$ (5%), which is a particle size in a particle size distribution curve of the filler at which particles having a particle size not more than said particle size account for 5% of the entire particles.

15. A photoelectric conversion device comprising:
   substrate having an electrode on one side;
   numerous crystalline semiconductor particles deposited on the substrate; and
   a glass insulator interposed among the crystalline semiconductor particles,
   wherein the glass insulator comprises plural materials and has a thermal expansion coefficient in the range of $30 \times 10^{-7}/°C$ to $60 \times 10^{-7}/°C$, and a softening point of 500° C. or below.

* * * * *